(12) United States Patent
Kupferberg et al.

(10) Patent No.: US 8,597,092 B2
(45) Date of Patent: Dec. 3, 2013

(54) FAN CONTROL SYSTEM

(76) Inventors: Minel Kupferberg, Hampstead (CA);
Marc Robitaille, Gatineau (CA)

( * ) Notice: Subject to any disclaimer, the term of this patent is extended or adjusted under 35 U.S.C. 154(b) by 389 days.

(21) Appl. No.: 11/905,619

(22) Filed: Oct. 2, 2007

(65) Prior Publication Data
US 2008/0274686 A1 Nov. 6, 2008

Related U.S. Application Data

(63) Continuation-in-part of application No. 11/089,026, filed on Mar. 25, 2005, now abandoned.

(51) Int. Cl.
*F24F 7/06* (2006.01)
*F24F 11/00* (2006.01)
*F24C 15/20* (2006.01)

(52) U.S. Cl.
USPC .................. 454/244; 454/238; 126/299 C

(58) Field of Classification Search
USPC .................. 454/244, 238, 239; 126/299
See application file for complete search history.

(56) References Cited

U.S. PATENT DOCUMENTS

| | | | | |
|---|---|---|---|---|
| 2,739,521 A * | 3/1956 | Spear | ............................ | 454/349 |
| 3,402,654 A * | 9/1968 | Berst | ............................ | 454/229 |
| 4,407,185 A * | 10/1983 | Haines et al. | ................. | 454/238 |
| 5,720,658 A * | 2/1998 | Belusa | ........................... | 454/238 |
| 6,185,952 B1 * | 2/2001 | McCollin | ......................... | 62/271 |

* cited by examiner

*Primary Examiner* — Steven B McAllister
*Assistant Examiner* — Helena Kosanovic
(74) *Attorney, Agent, or Firm* — Welsh Flaxman & Gitler LLC

(57) ABSTRACT

There is described a method for controlling an exhaust system having at least two fans, a plenum chamber interconnecting the at least two fans, and a bypass air damper in the plenum chamber to allow bypass air to flow therethrough, the method comprising: monitoring pressure in the plenum chamber of the system; detecting a variation of the pressure beyond a predetermined range; and regulating operation of the exhaust system in response to the pressure variation in order to return the pressure to within the predetermined range.

8 Claims, 2 Drawing Sheets

FAN CONTROL SYSTEM

CROSS-REFERENCE TO RELATED APPLICATIONS

This is a continuation-in-part application of Ser. No. 11/089,026, filed Mar. 25, 2005 now abandoned.

TECHNICAL FIELD

The present invention relates to the field of laboratories fume exhaust and particularly a control system to provide the exact exhaust requirements relating to the varying number of hoods in operation by a control system.

BACKGROUND OF THE INVENTION

Industrial and Laboratory exhaust systems may have at least one active fan and a standby fan. The standby fan is used whenever an active fan fails. In many cases, multiple fans are used as a more cost efficient way of providing the air flow requirements of the laboratory exhaust. A standby fan can be activated whenever one of the other fans fails.

Under-use of a fan can lead to premature bearing failure. Having a standby fan inactive for an extended period of time can lead to bearing and drive damage due to stagnant conditions.

In addition, large quantities of energy are wasted by having all fans running continuously in an environment with varying demand.

Therefore, there is a need to provide a control program for a more cost efficient system.

SUMMARY OF THE INVENTION

It is an object of this invention to overcome the drawbacks of existing systems.

In accordance with a first broad aspect of the present invention, there is provided a method for controlling an exhaust system having at least two fans, a plenum chamber interconnecting the at least two fans, and a make up air damper in the plenum chamber to allow bypass air to flow therethrough, the method comprising: monitoring pressure in the plenum chamber of the system; detecting a variation of the pressure beyond a predetermined range; and regulating operation of the exhaust system in response to the pressure variation in order to return the pressure to within the predetermined range.

Regulating operation of the fans includes such functions as energizing and/or de-energizing a single or multiple fans and modulating the bypass air damper to regulate the air pressure in the plenum chamber, maintaining the exhaust requirements.

In accordance with a second broad aspect of the present invention, there is provided an exhaust system assembly comprising: at least two fans; a plenum chamber having a make up air damper at one end, the plenum chamber interconnecting the at least two fans and having a pressure sensor therein for sensing and detecting pressure; and a control module receiving the pressure detected in the plenum chamber and adapted to regulate operation of the at least two fans when the pressure has varied beyond a predetermined range in order to restore the pressure to within the range.

The control module is connected via a pressure sensor to the plenum chamber where the pressure is sensed. The pressure measurements are used by the control module to determine whether a fan must be energized or de-energized and controls the bypass air damper.

In accordance with a third broad aspect of the present invention, there is provided in a computer network enabling communication between a plurality of computers, a method comprising: providing at least one sensing device in a fan exhaust system; monitoring at least one parameter of the system using the at least one sensing device; comparing the at least one parameter to a predetermined tolerance level; and sending an alarm signal through the network to a remote computer when the at least one parameter does not meet the predetermined tolerance level.

The sensing device can be a pressure sensor for the plenum chamber connecting multiple fans, a vibration transducer for the vibration of an individual fan, or any other parameter used to monitor the proper functioning of the system. The alarm signal is sent in the form of an email message to a remote computer, a light is lit, or equipment is disconnected.

DETAILED DESCRIPTION OF THE PREFERRED EMBODIMENT

Figure 1:
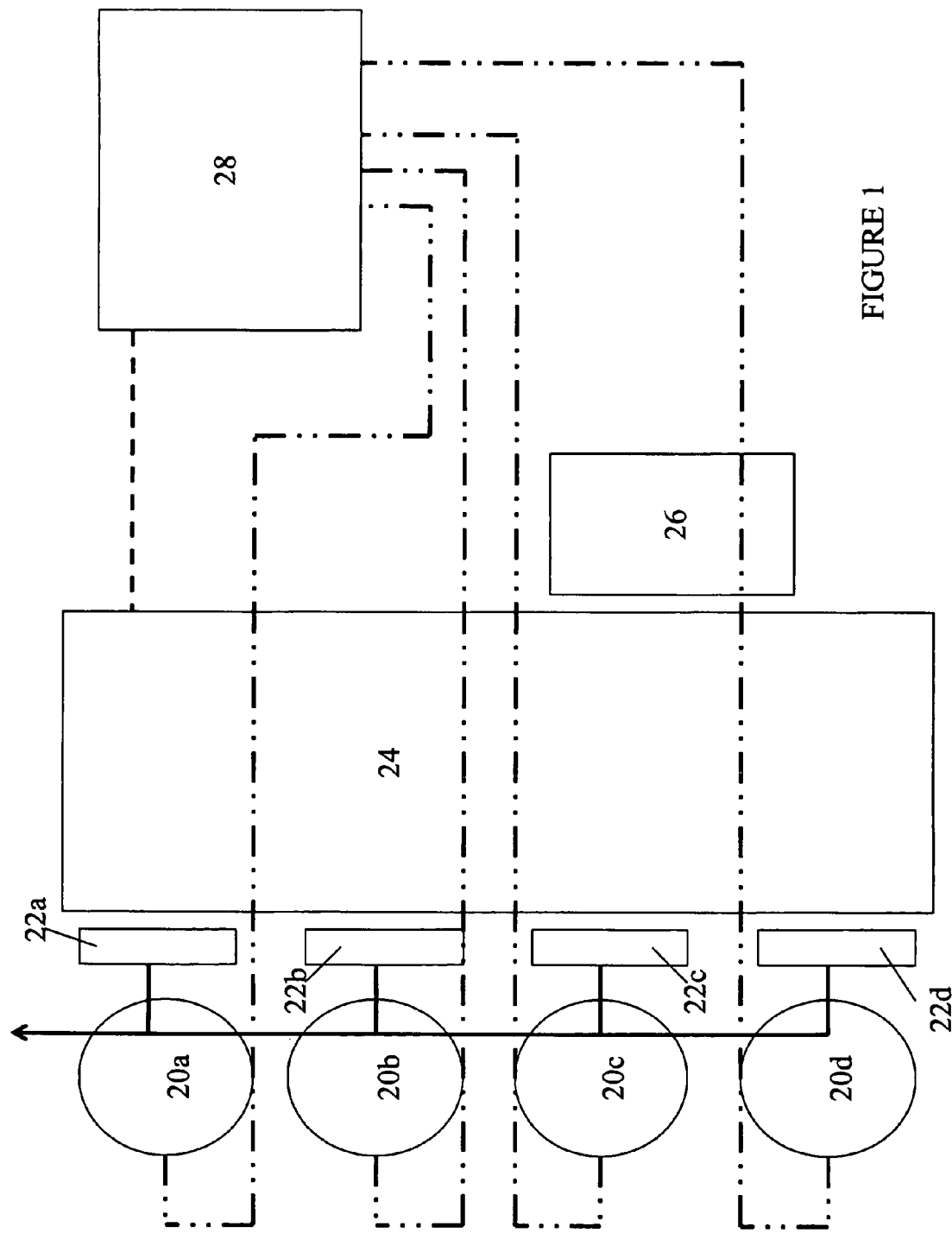
FIG. 1 is a block diagram of the exhaust system illustrating the parameters of the system.

The wiring diagram of FIG. 1 illustrates a system including four fans 20a, 20b, 20c, 20d, one of the four 20d being a standby fan. Should any of the active fans 20a, 20b, 20c fail, the standby fan 20d is activated. It should be understood that the control system in the present invention can be used with a system having two fans or more. Each fan 20a, 20b, 20c, 20d has its own isolation air damper 22a, 22b, 22c, 22d, which is used to shut off air flow when a fan is stopped. When the fans are stopped, the isolation air damper 22a, 22b, 22c, 22d are typically set in the fully closed positions. An isolation air damper is supplied with a full blade seal which provides a minimum amount of leakage when the damper is in the closed position. Isolation air dampers without seals are also possible.

A plenum chamber 24 interconnects all the fans 20a-20d via the isolation dampers 22a-22d. Negative static pressure is maintained in the plenum chamber 24 at all times when fans are on. The pressure within the plenum chamber is monitored as a control parameter for the system. If the pressure varies above or below a given range, this is an indication that the system must be stabilized by modulating the damper 26 or energizing/de-energizing a fan. A make up air damper, in this case a bypass air damper 26, is on the plenum chamber 24 to allow air to enter the plenum chamber 24. The bypass air damper 26 must be adjusted to control the amount of bypass air and maintain design static pressure in the laboratory hoods plenum.

The plenum receives exhaust from the laboratory hoods. The fans must expel the exhaust with enough velocity high in the atmosphere, to ensure that the exhaust is not reintroduced into the building through the make up air system. Each fan must be operating at full capacity for there to be sufficient exhaust velocity. The difference between the amount of exhaust entering the plenum and the capacity of the operating fans is made up by the air entering the plenum through the bypass air damper. When not enough exhaust is supplied to the plenum and the fans are operating at or near full capacity, an increase in vacuum pressure occurs in the plenum. Whenever the pressure deviates from a preset range, the amount of air introduced by the bypass air damper or the number of fans operating is adjusted. This may be accomplished by a control module monitoring the pressure within the plenum and controlling the operation of the bypass air damper and fans.

The relationship between the fan capacity, exhaust entering the plenum and outside air introduced through the bypass air damper is easily demonstrated by way of example. In a laboratory setting having multiple exhaust hoods, as an example, the exhaust entering the plenum is 60,000 CFM, the exhaust system will have four fans, each with a capacity of 20,000 CFM, ensuring that three fans operate to expel the exhaust required with one standby fan. If the plenum is provided with 30,000 CFM of exhaust from the building interior, two fans will operate and 10,000 CFM of outside air will be supplied through the bypass air damper. Slowing the fans to a capacity of 15,000 CFM will reduce the exhaust velocity, raising the possibility of the exhaust reintroduction into the building. Without the air volume supplied by the bypass air damper, the velocity of air at the face of the laboratory hood would increase creating undesirable conditions proximate the exhaust hoods. The additional air must be provided by a bypass air damper supplying air to the plenum. CFM and velocity at the face of the laboratory hood is critical with very small fluctuations tolerated.

Figure 2:
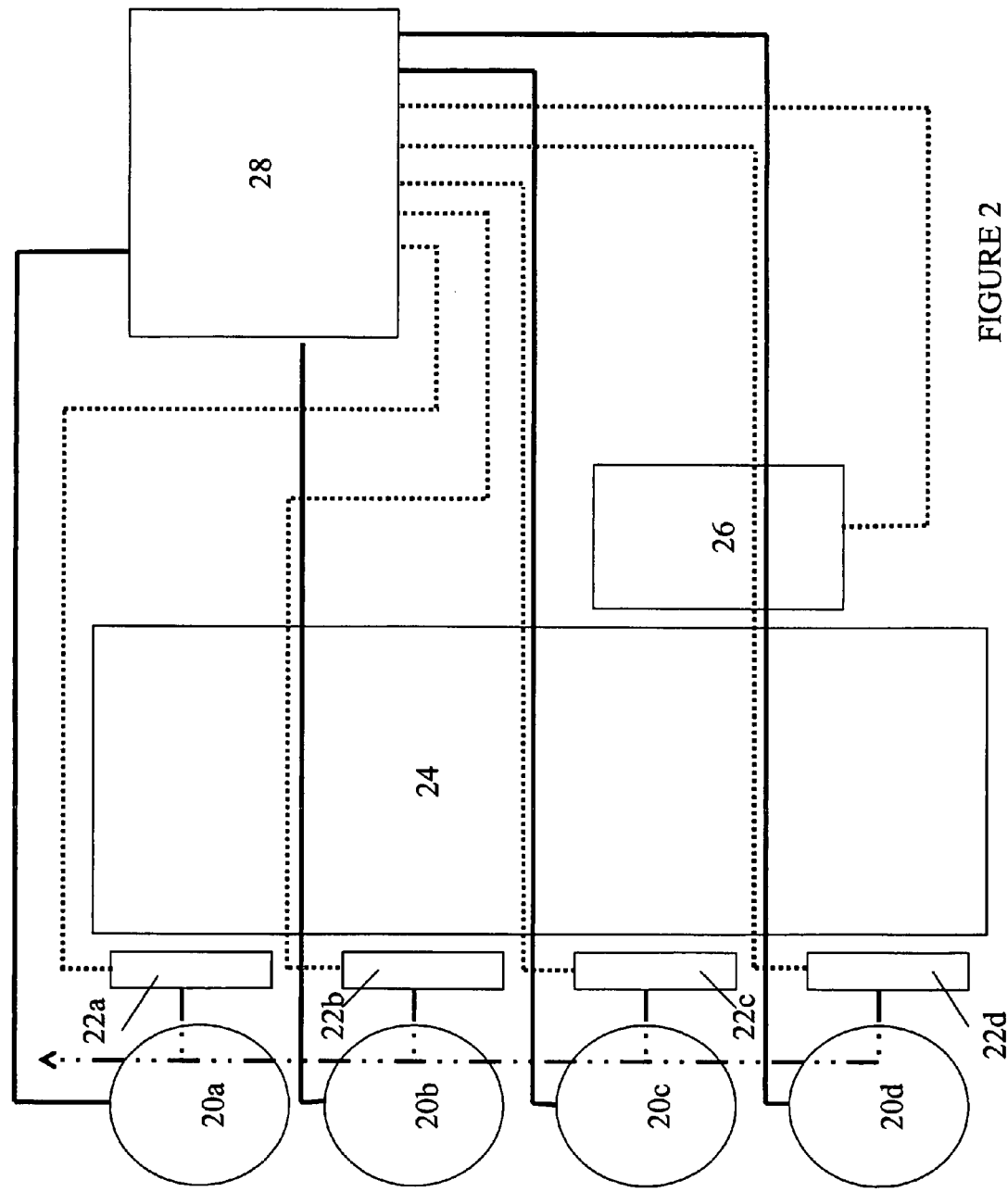
FIG. 2 is a block diagram of the exhaust system illustrating the wiring of the system.

A control module 28 is connected to the plenum chamber 24 via a pressure tap, as shown in FIG. 1. This is used to determine the status of the fans 20a-20d and the pressure of the plenum chamber 24. The control module 28 is also connected by wired connection to the bypass air damper 26 and the isolation dampers 22a-22d, either wirelessly or through wired connections, as shown in FIG. 2. Preferably, a 2-10VDC control signal is used to control the dampers. The control module 28 is connected to the fans 20a-20d through a starter.

According to one embodiment of the present invention, the control system turns on a standby fan while simultaneously turning off one of the active running fans, while maintaining constant pressure in the plenum chamber 24. In addition, the system rotates the fans which are being operated. Energy is saved by running only the number of fans needed to maintain the preset system static pressure. The system will shut off or add fans as needed. On a four fan system, the controller will, if necessary, operate only one fan to preserve energy. During that period, only 33% of power is used. The system can operate the system at 33%, 66%, 100%, by using one, two, or three fans, respectively.

For example, using a four fan system designed to operate three fans continuously and one standby fan at a total of 60000 cubic feet per minute (CFM) and 5" water-column (W.G.), each fan would use a 30 horsepower motor. Each motor at the current price of electricity can consume approximately $20000/year if they operate around the clock. Each fan could be selected with a 20000 CFM capacity. If the system demand changes to 30000 CFM, the control module 28 will de-energize one fan and use only two fans and use bypassed air as required. An energy saving of 33% is then achieved.

Assuming a situation where the system CFM may vary from 10000 CFM to 60000, the control module 28 would use one fan on the low end and three fans at the high end. On the low end, 66% of energy can be saved.

Through the use of a microprocessor, fans running are monitored for the number of hours of operation. A fan is de-energized after a set number of hours of operation and a standby fan is energized. The de-energized fan then becomes the standby fan. During this process, the microprocessor monitors the plenum chamber pressure and adjusts the bypass damper. The microprocessor also adjusts the rate that the isolation damper opens on the energized fan and closes on the de-energized fan in order to maintain a constant plenum chamber pressure.

The microprocessor monitors the operating fans for possible failures. If a fan fails, the next available fan will be energized. Energy saving is achieved through monitoring the amount of bypass air. When too much air is being bypassed, the control module 28 will de-energize a fan.

In a preferred embodiment, the control module 28 allows for three modes of operation: "AUTO", "OFF", and "MANUAL". In "AUTO" mode, the control module 28 checks its internal programming and the static pressure level to determine which fan is the current active fan and closes the appropriate contact for that fan. This contact activates the fan activation relay which in turn provides a closed contact to activate the fan. The appropriate isolation damper is opened by the control module 28 through the appropriate analog (or digital) output. Once the determined switching day/time has passed, the control module 28 will change the status of its digital outputs. The contact that was closed will open, and the contact that was open becomes closed. With this action, the fan that was the active fan prior to the contact change becomes the standby fan and vice-versa. The fan that was the standby fan prior to the switch goes through the same starting sequence as described above. The fan that was the active fan prior to the switch is shut down and the associated isolation damper actions precede the associated fan shutdowns in order to keep the negative pressure in the plenum chamber.

In "OFF" mode, none of the fan start relays are activated, so the fans cannot receive a start contact. Note that fans switched to "OFF" while the system start contact is engaged will result in a fan failure alarm when called upon to operated in "AUTO" mode.

In "MANUAL" mode, the fan (as selected) is activated, and the isolation damper is opened. The control outputs are bypassed and a constant signal is sent to the isolation damper to open it. Pressure switch verification of the pressure change is also not used in "MANUAL" mode.

The system is constantly monitoring the plenum chamber 24 static pressure with a pressure transmitter. A pressure signal is fed to the control module 28 which issues a control signal to the bypass damper to maintain the assigned/adjustable set point. If the negative static pressure needed cannot be maintained by one fan, the control module 28 will activate a second fan to help maintain the plenum chamber negative pressure. Alternatively, the control module 28 will initiate de-energizing fans.

A fan's alarm light is activated upon failure. A control panel will have a light that will be turned on to signal the failure. Substantially simultaneously, the appropriate relay is activated and a dry contact is closed to provide a fan-specific dry contact alarm. This alarm condition is maintained in the control module 28 until the alarm is reset either by dry contact or by a local push button.

Another parameter of the operating fans that can be monitored is vibration. All fans generate some vibration. It's only when vibration reaches a certain amplitude that it may cause damage to the fan. Vibration may be an indicator of some problem with a mechanism, or it may be a cause of other problems. High vibration can create heat which can break down lubricants in the bearings and, in addition, may cause metal fatigue in the bearings. Excessive vibration can cause fasteners to loosen or can cause fatigue failure of structurally loaded components. A device such as a vibration transducer may be used to sense vibratory motion and convert it into a signal for the purpose of measurement. When the measurement no longer corresponds to a vibration tolerance in accordance with a specific requirement, an alarm signal is activated to indicate that there may be a problem. A fan that vibrates excessively may have some type of mechanical failure and may be shut down. Other parameters, such as heat and rotations per minute (RPMs) of the fans can also be sensed and used as a control parameter for the system.

The control module 28 of the present invention may be connected to a computer network, allowing information to be sent to other computers. In a preferred embodiment, email messages are generated and sent upon any type of change that would occur in the system. For example, if the system were to adjust to a reduction in demand (by de-energizing a fan, for example), an email message would be generated and sent to a system operator to advise him of the change. Alternatively, messages may be sent only in the case of a problem, such as a fan failure or an increased vibration measurement. Such alarms would also appear on a typical LED control panel to allow an operator on-site to immediately see if there were a problem with the system.

In yet another embodiment, a remote user could access the system through his computer, either through the Internet or a special application installed on the computer. This would work in a similar way as the remote access of a work computer from home. Remote control software can be used to allow a user at a remote site to have control of a desktop computer via modem or the Internet. The remote control software is installed at both ends, and both users are controlling the local machine and viewing the same screen display simultaneously. A remote access server provides access to remote users via analog modem or ISDN connections. Including dial-up protocols and access control (authentication), it may be a regular file server with remote access software or a proprietary system, for example, Shiva's LANRover. The modems may be internal or external to the device.

The invention has been described with reference to preferred embodiments. Variations and modifications would be apparent to one of ordinary skill in the art and the invention encompasses such variations and modifications.

We claim:

1. A ventilation control system comprising:
    a plenum receiving exhaust from a building interior;
    a bypass air damper selectively permitting the flow of outside supply air to the plenum;
    at least two fans removing exhaust from the plenum, each of the at least two fans having a maximum flow rate capacity, wherein each of the at least two fans includes an isolation air damper interconnecting the at least two fans to the plenum; and
    a control module monitoring static air pressure within the plenum and controlling operation of the at least two fans and the bypass air damper, the control module detecting a variation in air pressure with the plenum and, issuing a control signal when the variation in air pressure occurs, and controlling the flow rate of air supplied by the bypass air damper to the plenum when the variation in air pressure is detected to maintain static air pressure within the plenum at a predetermined range and set point and the control module controlling speed and operation of each of the at least two fans based upon requirements of the ventilation control system, enabling the control module to turn off at least one of the at least two fans and turn on a stand-by fan based on a demand for air flow and increasing a speed of and operation of the at least two fans when the demand for air flow is high; wherein
    the bypass air damper selectively opening and closing to supply a difference in air between the maximum flow rate capacity of the at least two fans and the exhaust received by the plenum to maintain the static air pressure within the plenum at the predetermined range, wherein the ventilation control system records the position of the bypass air damper and the control module then sends a signal to close the bypass air damper when the demand for air flow on the building is low, or open the bypass air damper when the demand for air flow is high.

2. The ventilation control system of claim 1, further comprising at least one standby fan.

3. The ventilation control system of claim 1, wherein the at least two fans includes four fans and four associated isolation air dampers.

4. The ventilation control system of claim 3, further comprising at least one standby fan.

5. The ventilation control system of claim 1, wherein the control module includes a pressure measuring probe.

6. The ventilation control system of claim 1, wherein the control module is connected to the isolation air dampers and controls operation thereof.

7. The ventilation control system of claim 1, further comprising a computer network connected to the control module allowing information indicating that changes have occurred in the system to be relayed to other computers for off-site monitoring of the ventilation control system and changes that occur in the system.

8. The ventilation control system of claim 7, wherein the control module comprises at least one sensing device for sensing vibratory motion of at least one of the at least two fans and once the vibratory motion is sensed a signal is sent to shut down at least one of the at least two fans to prevent mechanical failure of the at least one of the at least two fans.

* * * * *